United States Patent [19]
Tomasini et al.

[11] Patent Number: 5,610,564
[45] Date of Patent: Mar. 11, 1997

[54] AC INTEGRATED COUPLER WITH PHASE EQUALIZER

[75] Inventors: Luciano Tomasini, Monza; Rinaldo Castello, Arcore, both of Italy

[73] Assignee: S.G.S. Thomson Microelectronics, S.r.l., Milan, Italy

[21] Appl. No.: 140,233

[22] Filed: Oct. 20, 1993

[30]  Foreign Application Priority Data

Oct. 30, 1992 [EP]  European Pat. Off. .............. 92830603

[51] Int. Cl.⁶ .................................................... H03H 11/04
[52] U.S. Cl. .......................... 333/173; 333/174; 379/394; 379/398; 379/414
[58] Field of Search ...................................... 379/414, 416, 379/417, 394, 398, 351, 443; 333/24 R, 172, 173, 174, 181

[56]  References Cited

U.S. PATENT DOCUMENTS

| | | | |
|---|---|---|---|
| 3,114,117 | 12/1963 | Anderson | 333/172 X |
| 4,801,888 | 1/1989 | Haque | 330/9 |

FOREIGN PATENT DOCUMENTS

| | | | |
|---|---|---|---|
| 2064517 | 7/1972 | Germany | 333/172 |

OTHER PUBLICATIONS

Hosticka et al., "MOS Sampled Data Recursive Filters Using Switched Capcitor Integrators," *IEEE Journal of Solid–State Circuits*, vol. SC–12, No. 6, Dec. 1977, pp. 600–608.

Dielacher et al., "A Software Programmable CMOS Telephone Circuit," *IEEE Journal of Solid State Circuits* 26:1015–1026, 1991. See p. 1021, left col., line 4; p. 1024, left col. line 9, figs. 1, 11–15 No Month.

*Primary Examiner*—Benny Lee
*Assistant Examiner*—Justin P. Bettendorf
*Attorney, Agent, or Firm*—David V. Carlson; Seed and Berry LLP

[57]  ABSTRACT

A monolithically integrated AC coupling circuit is presented for DC uncoupling and AC coupling (typically in telephone applications) to an input signal. The AC coupler includes a high-pass filter having a first pole at a frequency well below a frequency of interest and a zero at zero frequency. The AC coupler also includes a pole/zero doublet between the frequency of the first pole and the frequency of interest. The frequency of the first pole for a specified error is increased by addition of the doublet. Because the frequency of the first pole is increased, the size of the required capacitors is decreased, enabling integration. An implementation of the circuit using switched capacitor techniques is described. An alternative circuit employing a unit gain interface is presented. The alternative circuit reduces the dynamic range and driving voltage requirements of its field-effect transistors.

10 Claims, 3 Drawing Sheets

5,610,564

AC INTEGRATED COUPLER WITH PHASE EQUALIZER

TECHNICAL FIELD

This invention relates to alternating current coupling circuits (AC couplers), particularly to such AC couplers as are useful in telephone circuit applications.

BACKGROUND OF THE INVENTION

Many transmission system circuits require AC coupling to the outside world to eliminate problems of DC incompatibility between external signals from outside the circuit and reference points of various nodes within the circuits.

An AC coupler, in addition to blocking DC signals, preferably admits AC signals unaffected in a frequency band of interest (though a constant attenuation in the frequency band may be tolerated). The transfer function of an AC coupler is, therefore, often chosen to be a high-pass type with one or more zeroes at the origin. In the instance of telephone circuits, the band of interest begins at 300 Hz. Accordingly, AC couplers in telephone circuits typically have poles at much less than 300 Hz (usually close to 1 Hz), in order to have a negligible error in the band of interest.

The availability of an AC coupler which conforms with the specifications of different telephone companies without the use of external components is an important condition to the development of new speech circuits which are cost-effective and reliable. Current art solutions provide for the use of discrete components external to the AC coupler in conjunction with monolithically integrated circuits.

For example, an AC coupler having a transfer function with a pole at a frequency on the order of one Hertz is typically implemented with an external capacitor of some tens of µF and an internal resistance on the order of tens of kiloohms The use of such external components lowers the degree of reliability and raises costs. Additionally, the AC coupling in some cases is implemented between internal blocks of the integrated circuit. In such a case, besides the external component, two additional pins are also required for connection to the AC coupler.

In any case, the presence of an external capacitor involves a further disadvantage, in that upon turning on the circuit, a charge current of at least a few milliamperes is required to attain steady-state voltage at the external capacitor within a short time.

SUMMARY OF THE INVENTION

It is an object of this invention to provide an AC coupling circuit which has all its components integrated monolithically.

Another object of the invention is to ensure "high-pass" operation with greatly reduced phase error in the transfer function and excellent overall accuracy.

These objects are achieved by an AC coupling circuit comprising a first capacitive element connected between an input terminal and an output terminal, a second capacitive element connected serially to first resistive element to form a first series RC circuit, said first series RC circuit connected in parallel to said first capacitive element to form an input RC admittance, a third capacitive element and second resistive element connected in parallel to form a parallel RC circuit, the parallel RC circuit connected between the output terminal and a reference terminal.

Another embodiment of the invention includes an AC coupling circuit having at least one input terminal and one output terminal, and at least a first and second reference terminal each of said reference terminals being connected to a respective reference potential comprising first and second capacitive element connected serially together, the first capacitive element being connected between an input terminal and the output terminal, and the second capacitive element connected between the output terminal and the first reference terminal; a third capacitive element and a first and second field-effect transistors being connected in series at a first connection node, through their respective source and drain terminals, with the third capacitive element between the input terminal and the output terminal, and a third and fourth field-effect transistors connected serially together at a second connection node through their respective source and drain terminals, between the output terminal and the second reference terminal, the first and second connection nodes each being coupled through capacitive elements to the first reference terminal and the gate terminals of the first, second, third and fourth transistors being adapted for connection to a control signal generator with two non-overlapping phases.

Another embodiment of the invention includes an alternating current coupling circuit having at least one input terminal and one output terminal, and at least a first and second reference terminals for connection to a reference potential, comprising first and second capacitive elements connected serially together at a first connection node to which is connected the output terminal, the first capacitive element being connected between the input terminal and the output terminal and the second capacitive element being connected between the output terminal and the first reference terminal at least one unitary gain AC interface circuit means having an interface circuit means input terminal and an interface circuit means output terminal, the interface circuit means input terminal connected to the first connections node; third and fourth capacitive elements connected serially together to form a second connection node and said serially connected third and fourth capacitive elements being connected in parallel with the second capacitive element at least first and second field-effect transistors connected serially together through their respective source and drain terminals to form a third connection node, the serially connected first and second field-effect transistors being connected between the second connection node the interface circuit means output terminal and at least third and fourth field-effect transistors connected serially together through their respective source and drain terminals to form a fourth connection node between the output terminal and a second reference terminal said second reference terminal connected to a second reference potential, the third connection circuit node between the first and second transistors and the fourth connection circuit node between the third and fourth transistors being coupled through capacitive elements to the first reference terminal and the gate terminals of said first, second, third and fourth transistors being adapted for connection to a control signal generator with two non-overlapping phases.

The features and advantages of a coupling circuit according to the invention will be apparent from the following detailed description of embodiments thereof, given by way of example and not of limitation in the accompanying drawings.

DETAILED DESCRIPTION OF THE INVENTION

Figure 1:
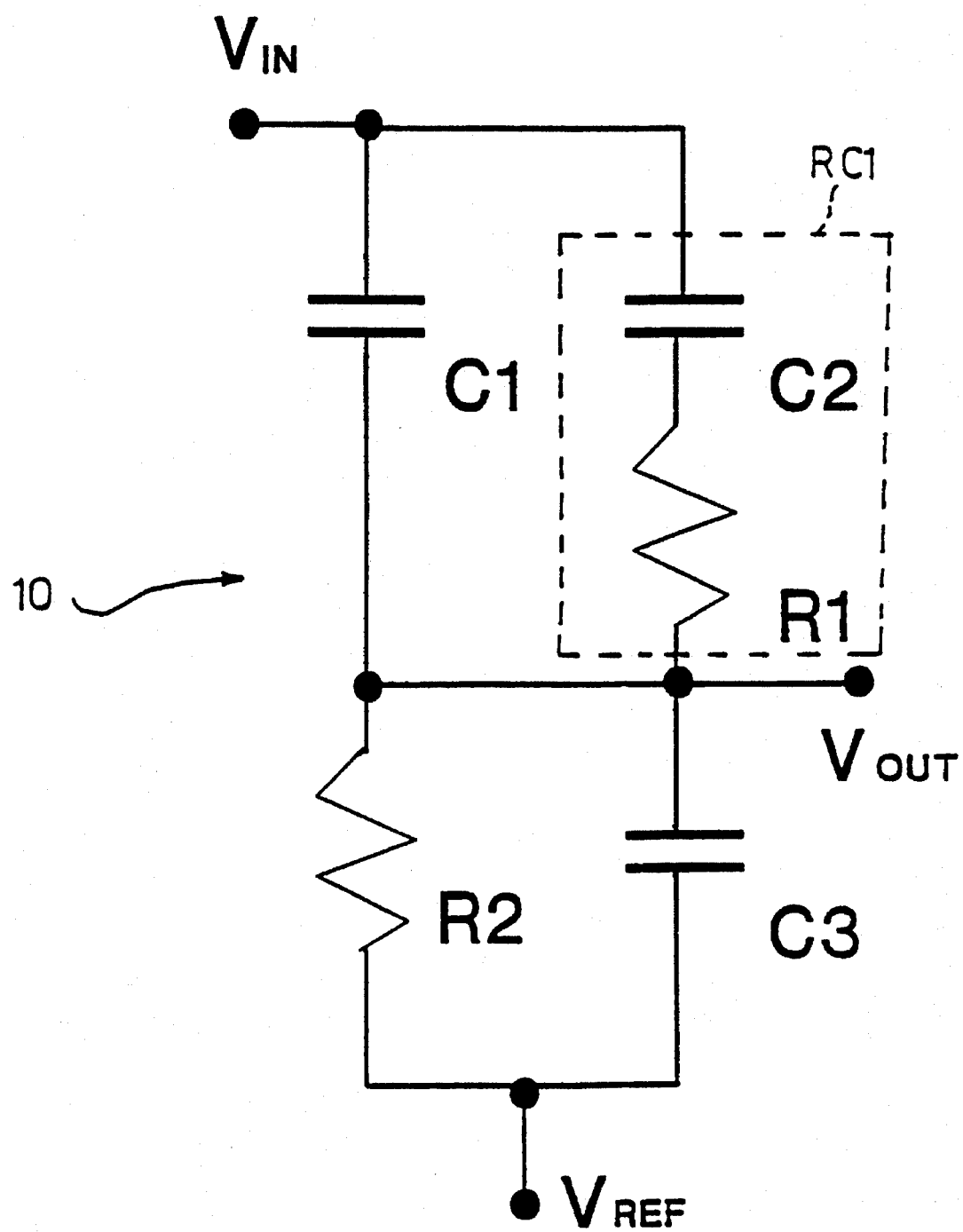
FIG. 1 is a circuit diagram showing an AC coupling circuit according to the invention.

Shown diagramatically in FIG. 1 is an AC coupler circuit 10 adapted to provide a transfer function wherein by suitable introduction of a doublet, i.e. a pole and a zero at near-coincident frequencies, the phase error can be significantly reduced, that is the phase can be "equalized." The AC coupler circuit 10 comprises a capacitor C1 connected between an input terminal Vin and an output terminal Vout.

Connected in parallel with the capacitor C1 is a series RC circuit RC1 including a capacitor C2 and a resistor R1. A capacitor C3 and a resistor R2 in parallel with each other are connected between the output terminal Vout and a reference terminal Vref for connection to a reference potential, e.g., to ground.

For a frequency fe which is the lower extreme of the signal band of interest in the high-pass mode of the AC coupler circuit 10, the maximum error E in the transfer function of the AC coupler circuit 10 is:

$$E=[H(\infty)-H(fe)]/H(\infty)$$

where $H(\infty)$ is the value of the transfer function of the AC coupling circuit at a high frequency (ideally, infinite frequency) and $H(fe)$ is the value of the transfer function at frequency fe. The error E is due to the presence of the zero at the origin and to a first pole at frequency fl.

As one skilled in the art will readily recognize, the circuit of FIG. 1 introduces a pole/zero doublet which is localized at a frequency f2. The frequency f2 is chosen to be higher than the frequency f1 of the first pole but lower than the frequency fe.

In the instance of a telephone speech circuit, the frequency fe would typically be 300 Hz.

To obtain an error of less than 0.3% in the absence of the pole/zero doublet, the frequency fl should then be below 1 Hz.

On the other hand, by introducing, in accordance with this invention, a doublet at a frequency f2 between the frequency f1 and the frequency fe, the same error can be obtained with the first pole at a frequency fl' which is higher than the frequency fl. For example, if the frequency f2 of the doublet is chosen to be 50 Hz, with a doublet distance d equal to 0.2 where d=fo−fp; fo is the frequency of the zero; and fp is the frequency of the pole of the doublet; the error of 0.3% can be obtained with the frequency fl' of the first pole at 10 Hz.

Thus, with the AC coupler 10 according to the invention, whose transfer function includes a pole/zero doublet, the first pole of the transfer function may be shifted upwards in frequency by a factor of 10 compared to embodiments with no doublet. A circuit according to the invention can, therefore, be fully integrated monolithically by virtue of the ample saving in silicon area that such a shift in the frequency fl of the first pole affords to an integrated circuit implementation.

Actually, the integration of the circuit shown in FIG. 1 can be more conveniently implemented using switched-capacitor techniques.

Switched-capacitor techniques are a viable way to provide integrated time constants of large value concurrent with good accuracy.

Figure 2:
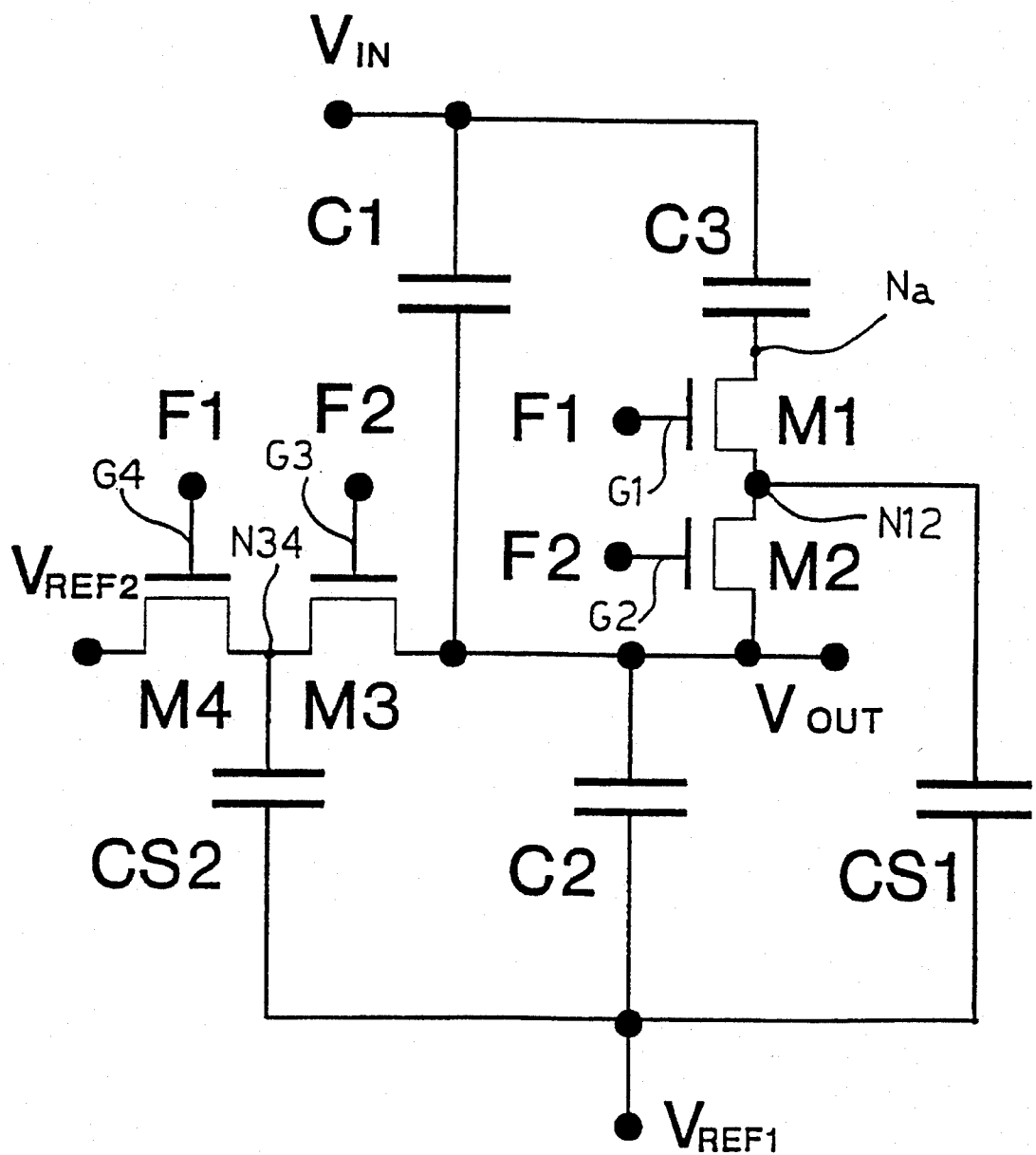
FIG. 2 shows circuitry for implementing the basic diagram by a conventional switched-capacitor technique.

Shown in FIG. 2 is a circuit diagram for an AC coupler according to the invention which can be implemented in the switched-capacitor form. This scheme, unlike that shown in FIG. 1, provides—for reasons inherent to applications of the telephone type—two discrete reference terminals, Vref1 and Vref2, for connection to reference potentials. Both of these reference terminals Vref1, Vref2 may, however, be connected to the same reference potential, e.g. to ground.

The AC coupler 10 comprises two capacitors, C1 and C2, which are respectively connected between an input terminal Vin and an output terminal Vout, and between said output terminal Vout and the first reference terminal, Vref1, to provide a connection to a first reference potential.

Connected serially together and in parallel with the capacitor C1 are a capacitor C3 and two field-effect transistors M1 and M2. Two more field-effect transistors, M3 and M4, are connected between the output terminal Vout and the second reference terminal, Vref2, which is connected to a second reference potential.

The connection nodes N12, N34 between the transistors M1 and M2, and between the transistors M3 and M4, are coupled through capacitors Cs1 and Cs2, respectively, to the first reference terminal, Vref1, to provide reference to the first reference potential.

In accordance with the switched-capacitor technique, the gate terminals G1, G2 and G3, G4 of each transistor pair M1, M2, and M3, M4 are applied control signals F1 and F2 generated by a control signal generator (not shown) at two non-overlapping time phases, which signals may be also referred to as clock signals, usually at a frequency of 64 kHz in telephone applications.

Typical capacitance values are C1=30 pF, C2=60 pF, C3=20 pF and Cs1=Cs2=100 pF. Matching of the frequencies involved can be achieved using switched-capacitor techniques as is known in the art. In addition, accuracy of the input/output gain value can be improved using high capacitances.

A practical problem encountered with the solution shown in FIG. 2 is that the transistors M1 and M2 are connected to an input signal at the input terminal Vin through the capacitor C3 which represents a short circuit to the input signal in the band of interest. For this reason, the signal applied to the input terminal Vin is transferred to the connection node Na between the capacitor C3 and the transistor M1. Thus, the connection node Na has a wide dynamic range and requires that high clock voltages be used for it to operate properly. This poses some difficulties where the voltage supply to the chip is derived from the line (with long lines, this voltage supply may be as low as 2.5 Volts).

A further problem is that upon turning on, the connection node Na may reach voltages as high as the maximum voltage of the input signal at the input terminal Vin (12 Vmax), and this voltage cannot be accepted by typical MOS devices which have generally a maximum operating voltage of 5 Volts.

Figure 3:
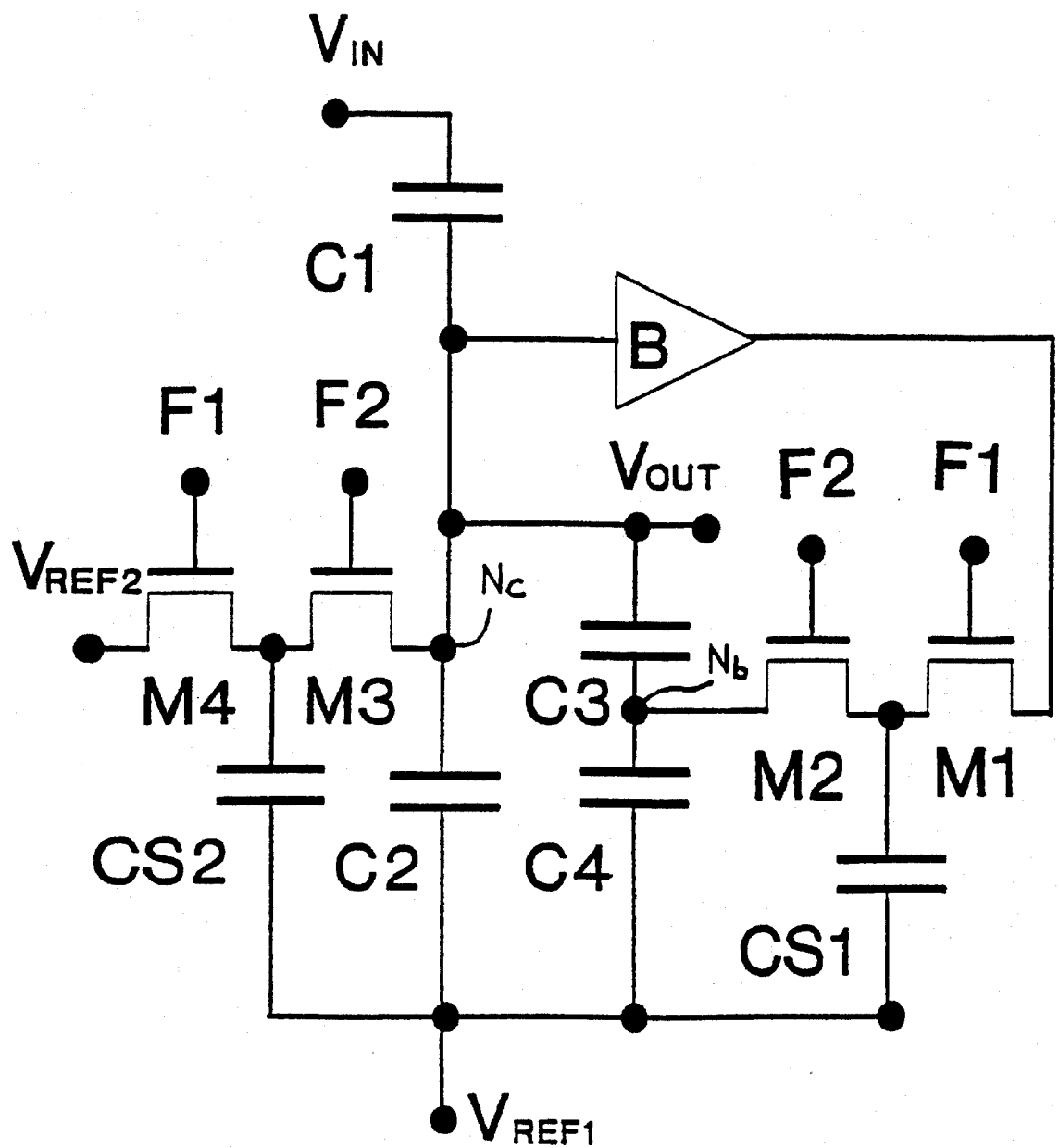
FIG. 3 shows improved implementation circuitry using the same technique.

Shown in FIG. 3 is the circuit diagram of an AC coupler according to the invention, which obviates these drawbacks at the expense of a slight increase in integration area.

Compared to the circuit of FIG. 2, a unitary gain AC interface circuit means B replaces the capacitor C3. An alternate capacitor C3' is connected between the output terminal Vout and the connection node N12 between the transistor pair M1, M2.

The AC coupler of FIG. 3 further comprises a capacitor C4, connected in series with the capacitor C3 between the output terminal Vout and the first reference terminal Vref1.

The transistor pair M1, M2 are connected here to a connection node Nb between the capacitor C3 and C4.

The advantage of these novel solutions is that all the MOS devices are connected therein to lower voltages than the voltage at a connection node Nc between the capacitors C1 and C2.

Using C1=(⅓) C2, the signal at the connection node Nc is approximately one fourth the signal Vin. Consequently, the dynamic range required of the clock driving the gates of the MOS transistors M1, M2 and M3, M4 is much reduced.

Additionally, upon turning on, the source-to-drain voltages on the transistors M1, M2 and M3, M4 from the input signal at the input terminal Vin (line) is reduced by a factor of four on account of the capacitive divider.

Thus, by limiting the dynamic range of the input signal at the input terminal Vin to 12 Volts (e.g., by using a Zener diode), the dynamic range at the connection node Nc can be set at 3 Volts.

This voltage is consistent with the specifications of MOS transistors.

It is understood that the circuits described and illustrated in the foregoing may be altered and modified without departing from the scope of this invention.

We claim:

1. An alternating current coupling circuit, comprising:
   at least one input terminal and one output terminal;
   at least first and second reference terminals for connection to a reference potential;
   first and second capacitive elements connected serially together, respectively between the input terminal and the output terminal, and between said output terminal and the first terminal for connection to a reference potential, that it comprises;
   a third capacitive element and first and second field-effect transistors being connected in series, through their respective source and drain terminals, with said third capacitive element between the input terminal and the output terminal; and
   third and fourth field-effect transistors connected serially together, through their respective source and drain terminals, between the output terminal and the second terminal for connection to a reference potential, the connection nodes between the first and second transistors and between the third and fourth transistors being coupled through capacitive elements to the first terminal for connection to a reference potential, and the gate terminals of said first, second, third and fourth transistors being adapted for connection to a control signal generator with two non-overlapping phases.

2. A coupling circuit according to claim 1, wherein the capacitive elements are monolithically integrated devices.

3. A coupling circuit according to claim 2 wherein the first and fourth transistors are adapted to be driven by a control signal of a first phase and the second and third transistors are adapted to be driven by a control signal of a second phase, said first and second phases not overlapping.

4. The coupling circuit of claim 1 wherein the capacitance values of the first and second capacitive elements are selected to produce a first pole at a first frequency below a selected frequency and a second pole at a second frequency above the selected frequency.

5. An alternating current coupling circuit having at least one input terminal and one output terminal, a first and second reference terminals for connection to a reference potential, comprising:
   first and second capacitive elements connected serially together at a first connection node, the first connection node being connected to the output terminal, the first capacitive element being connected between the input terminal and the output terminal and the second capacitive element being connected between the output terminal and the first reference terminal;
   a unitary gain AC interface circuit means having an interface circuit means input terminal and an interface circuit means output terminal, the interface circuit means input terminal connected to the first connection node;
   third and fourth capacitive elements connected serially together at a second connection node, said serially connected third and fourth capacitive elements being connected in parallel with the second capacitive element between the output terminal and the first reference terminal;
   at least first and second field-effect transistors connected serially together through their respective source and drain terminals at a third connection node, the serially connected first and second field-effect transistors being connected between the second connection node and the interface circuit means output terminal; and
   third and fourth field-effect transistors connected serially together through their respective source and drain terminals at a fourth connection node between the output terminal and a second reference terminal, the third connection circuit node between the first and second transistors and the fourth connection circuit node between the third and fourth transistors being coupled through fifth and sixth capacitive elements to the first reference terminal and the gate terminals of said first, second, third and fourth transistors being adapted for connection to a control signal generator with two non-overlapping phases.

6. A coupling circuit according to claim 5 wherein the capacitive elements are integrated monolithically to the circuit itself.

7. A coupling circuit according to claim 6 characterized in that the first and fourth transistors are driven by control signals whose phase does not overlap that of control signals driving the second and third transistors.

8. An integrated coupling circuit responsive to first and second clock signals, the clock signals having non-overlapping phases, comprising:
   an input terminal;
   a first capacitor coupled to the input terminal;
   a second capacitor serially coupled to the first capacitor at a node;
   a serially connected first switch pair between the node and a first reference potential wherein the first switch in the pair is connected to receive the first clock signal at a respective control input and the second switch in the pair is connected to receive the second clock signal at a respective control input;
   a second pair of switches serially coupled between the node and a second reference potential, wherein the first switch in the second pair is coupled to receive the first clock signal at a respective control input and the second switch in the second pair is coupled to receive the second clock signal at a respective control input; and
   a buffer serially coupled with the second switch pair between the node and the second reference potential.

9. The coupling circuit of claim 8 wherein the buffer has a unity gain.

10. The coupling circuit of claim 9, further including a third capacitor coupled between the second switch in the second pair and the node.

* * * * *

UNITED STATES PATENT AND TRADEMARK OFFICE
CERTIFICATE OF CORRECTION

PATENT NO.     : 5,610,564
DATED          : March 11, 1997
INVENTOR(S)    : Luciano Tomasini and Rinaldo Castello It is certified that error appears in the above identified patent and that said Letters Patent is hereby corrected as shown below:

In column 5, claim 5, line 60, following "terminal," (second occurrence) insert "and" and delete --a--

Signed and Sealed this

Seventh Day of April, 1998

Attest:

BRUCE LEHMAN

*Attesting Officer*     *Commissioner of Patents and Trademarks*